(12) United States Patent
Zhang et al.

(10) Patent No.: US 10,546,743 B2
(45) Date of Patent: Jan. 28, 2020

(54) ADVANCED INTERCONNECT WITH AIR GAP

(71) Applicants: STMicroelectronics, Inc., Coppell, TX (US); International Business Machines Corporation, Armonk, NY (US)

(72) Inventors: John H. Zhang, Altamont, NY (US); Yann Mignot, Slingerlands, NY (US); Lawrence A. Clevenger, LaGrangeville, NY (US); Carl Radens, LaGrangeville, NY (US); Richard Stephen Wise, Ridgefield, CT (US); Yiheng Xu, Hopewell Junction, NY (US); Yannick Loquet, Domene (FR); Hsueh-Chung Chen, Cohoes, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/874,654

(22) Filed: Jan. 18, 2018

(65) Prior Publication Data
US 2018/0144926 A1    May 24, 2018

Related U.S. Application Data

(62) Division of application No. 14/098,286, filed on Dec. 5, 2013, now abandoned.

(51) Int. Cl.
*H01L 21/02*    (2006.01)
*H01L 23/522*    (2006.01)
(Continued)

(52) U.S. Cl.
CPC .... *H01L 21/0217* (2013.01); *H01L 21/31144* (2013.01); *H01L 21/7682* (2013.01);
(Continued)

(58) Field of Classification Search
CPC .......... H01L 21/7682; H01L 21/76831; H01L 21/76829; H01L 23/5226; H01L 23/5329
See application file for complete search history.

(56) References Cited

U.S. PATENT DOCUMENTS 4,666,556 A    5/1987 Fulton et al.
5,904,565 A *  5/1999 Nguyen ............ H01L 21/76801
                                            257/E21.168
(Continued)

OTHER PUBLICATIONS

Xu et al., "Synthesis and Characterization of Porous Polymeric Low Dielectric Constant Films" in Journal of Electronic Materials, vol. 30, No. 4, 2001. pp. 309-313. (Year: 2001).*

(Continued)

*Primary Examiner* — Tuan A Hoang
(74) *Attorney, Agent, or Firm* — Seed Intellectual Property Law Group LLP

(57) ABSTRACT

Ultra-low-k dielectric materials used as inter-layer dielectrics in high-performance integrated circuits are prone to be structurally unstable. The Young's modulus of such materials is decreased, resulting in porosity, poor film strength, cracking, and voids. An alternative dual damascene interconnect process incorporates air gaps into a high modulus dielectric material to maintain structural stability while reducing capacitance between adjacent nanowires. Incorporation of an air gap having k=1.0 compensates for the use of a higher modulus film having a dielectric constant greater than the typical ultra-low-k (ULK) dielectric value of about 2.2. The higher modulus film containing the air gap is used as an insulator between adjacent metal lines, while a ULK film is retained to insulate vias. The dielectric layer between two adjacent metal lines thus forms a ULK/high-modulus dielectric bi-layer.

19 Claims, 8 Drawing Sheets

(51) Int. Cl.
H01L 23/532 (2006.01)
H01L 21/311 (2006.01)
H01L 21/768 (2006.01)

(52) U.S. Cl.
CPC .... *H01L 21/76831* (2013.01); *H01L 23/5222* (2013.01); *H01L 23/5226* (2013.01); *H01L 23/5329* (2013.01); *H01L 23/53295* (2013.01); *H01L 2924/0002* (2013.01)

(56) References Cited

U.S. PATENT DOCUMENTS

| | | | | |
|---|---|---|---|---|
| 6,159,840 | A | * | 12/2000 | Wang ............... H01L 21/76808 257/E21.579 |
| 6,297,554 | B1 | * | 10/2001 | Lin .................. H01L 21/76808 257/752 |
| 7,138,329 | B2 | * | 11/2006 | Lur .................... H01L 21/7682 438/619 |
| 7,172,980 | B2 | | 2/2007 | Torres et al. |
| 7,969,010 | B2 | | 6/2011 | Usami |
| 7,973,409 | B2 | * | 7/2011 | Yang ................. H01L 21/7682 257/751 |
| 8,035,232 | B2 | | 10/2011 | Harada et al. |
| 8,227,336 | B2 | | 7/2012 | Edelstein et al. |
| 8,383,507 | B2 | | 2/2013 | Chanda et al. |
| 8,900,990 | B2 | | 12/2014 | Zhang |
| 2003/0016055 | A1 | | 1/2003 | Oodaira et al. |
| 2005/0208753 | A1 | | 9/2005 | Ott et al. |
| 2005/0266698 | A1 | * | 12/2005 | Cooney, III ...... H01L 21/02107 438/765 |
| 2007/0264820 | A1 | | 11/2007 | Liu et al. |
| 2008/0044999 | A1 | | 2/2008 | Dubin et al. |
| 2008/0265377 | A1 | * | 10/2008 | Clevenger .......... H01L 21/7682 257/618 |
| 2009/0004844 | A1 | | 1/2009 | Hsia et al. |
| 2009/0081862 | A1 | | 3/2009 | Chen et al. |
| 2009/0093100 | A1 | * | 4/2009 | Xia ..................... C23C 16/325 438/421 |
| 2009/0093112 | A1 | | 4/2009 | Al-Bayati et al. |
| 2010/0252929 | A1 | | 10/2010 | Budrevich et al. |
| 2011/0084357 | A1 | | 4/2011 | Liu et al. |
| 2011/0140281 | A1 | | 6/2011 | Sekine et al. |
| 2011/0221062 | A1 | | 9/2011 | Clevenger |
| 2011/0260326 | A1 | | 10/2011 | Clevenger et al. |
| 2012/0013022 | A1 | * | 1/2012 | Sabuncuoglu Tezcan ................. H01L 21/7682 257/774 |
| 2012/0223411 | A1 | | 9/2012 | Cho et al. |
| 2012/0280290 | A1 | * | 11/2012 | Khakifirooz ........ H01L 27/0207 257/288 |
| 2013/0207267 | A1 | | 8/2013 | Rho |
| 2013/0267088 | A1 | | 10/2013 | Baek et al. |
| 2014/0252625 | A1 | | 9/2014 | Ting et al. |
| 2014/0264896 | A1 | | 9/2014 | Lu et al. |
| 2015/0076705 | A1 | | 3/2015 | Singh et al. |

OTHER PUBLICATIONS

Lane et al., "Environmental Effects on Cracking and Delamination of Dielectric Films," *IEEE Transactions on Device and Materials Reliability* 4(2):142-147, Jun. 2004.

Liniger et al., "Moisture-driven crack growth in blanket low dielectric constant and ultralow dielectric constant films," *Journal of Applied Physics* 96(6):3482-3485, Sep. 2004.

Martin et al., "Integration of SiCN as a low k etch stop and Cu passivation in a high performance Cu/low k interconnect," International Proceedings of the IEEE 2002 Interconnect Technology Conference, pp. 42-44.

Wu et al., "Advanced metal barrier free Cu damascene interconnects with PECVD silicon carbide barriers for 90/65-nm BEOL technology," International Electron Devices Meeting 2002, pp. 595-598.

Xu et al., "Synthesis and Characterization of Porous Polymeric Low Dielectric Constant Films," *Journal of Electronic Materials*, vol. 30, No. 4, 2001, pp. 309-313.

* cited by examiner

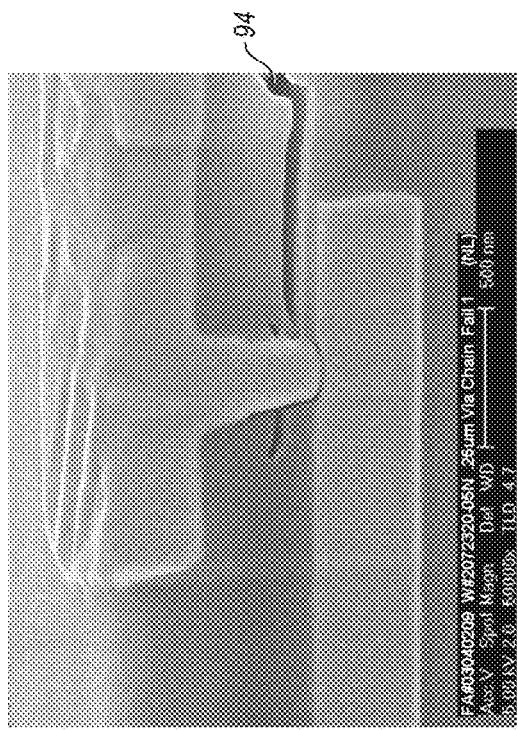
Fig. 2A (PRIOR ART)
Fig. 2B (PRIOR ART)
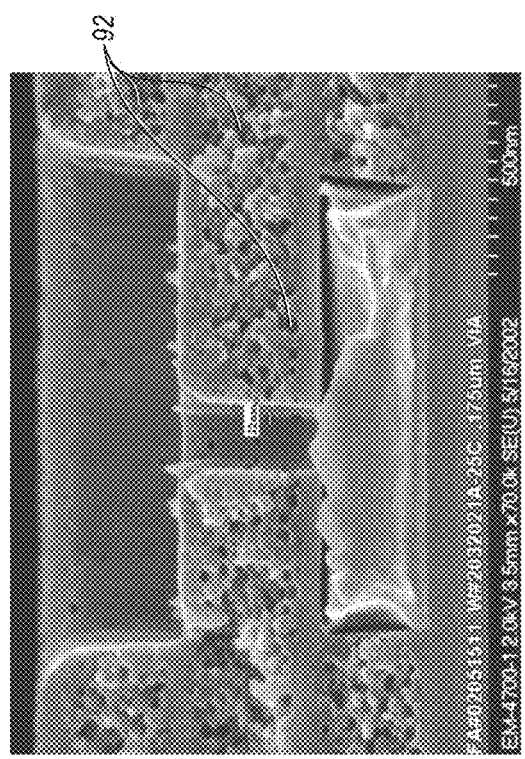
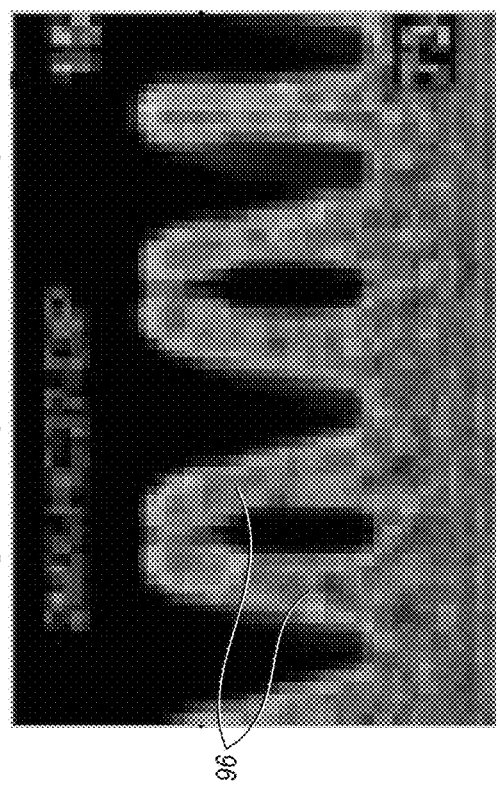
Fig. 2C (PRIOR ART)
Fig. 2D (PRIOR ART)

Properties of Ultra Low-k Dielectric Materials and SiO$_2$

| Property | Low-k | SiO2 |
|---|---|---|
| Density (g/cm3) | 1.03 | 2.2 |
| Dielectric Cons. | 1.9-2.5 | 3.9 |
| Modulus (GPa) | 3-9 | 55-70 |
| Hardness (GPa) | 0.3-0.8 | 3.5 |
| Porosity (est.) | 35-65% | NA |
| Avg. Pore Size, nm | < 2.0-10 | NA |
| Thermal Conductivity (W/m K) | 0.26 | 1.4 |

*Fig. 3*

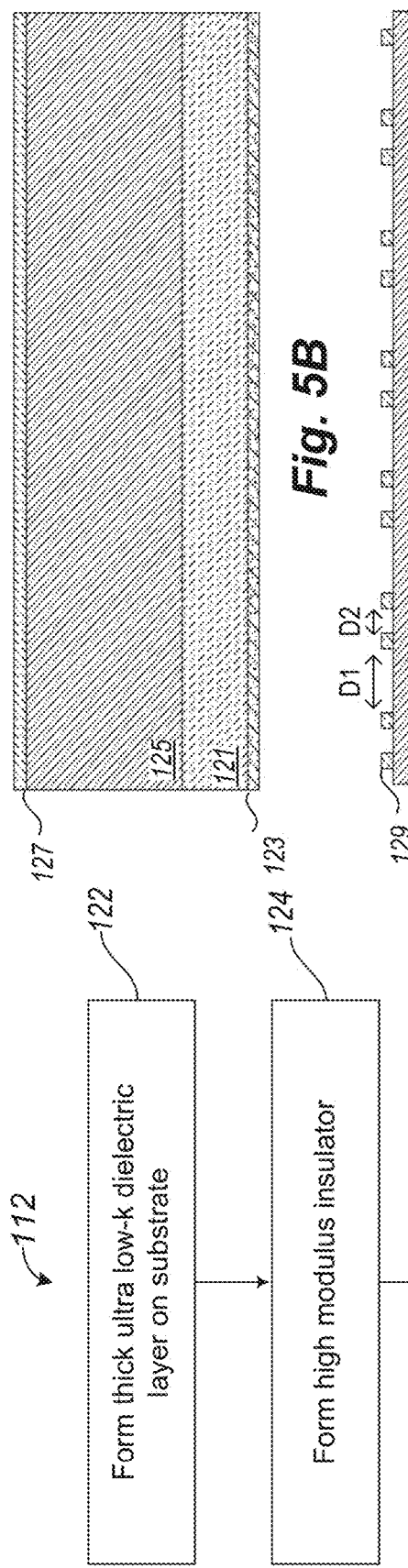
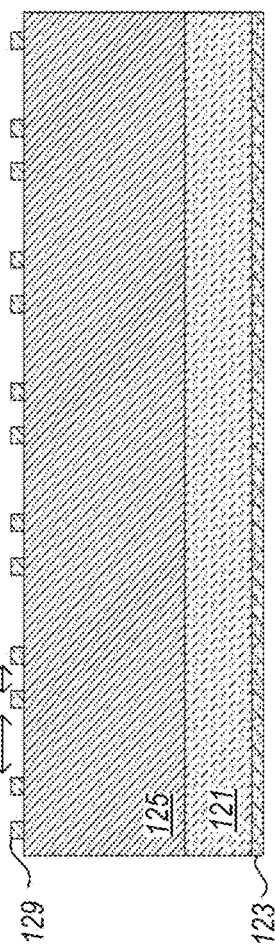
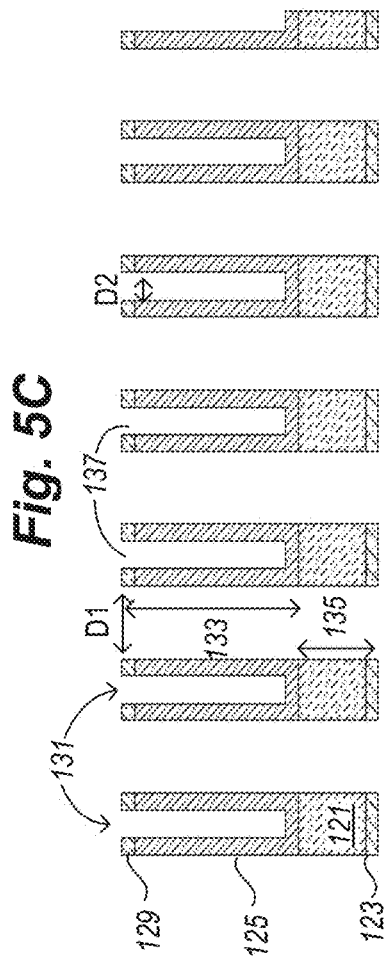
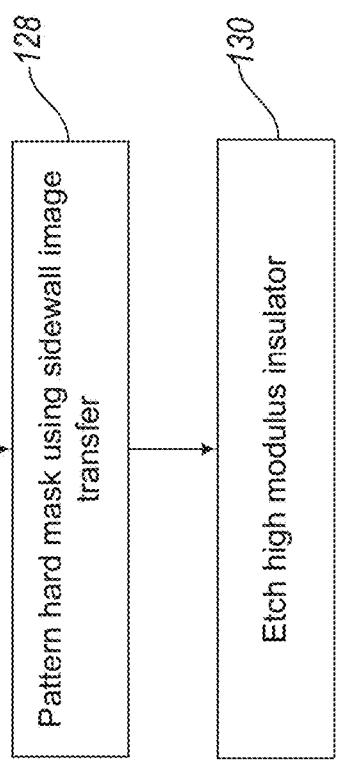
Fig. 5A
Fig. 5B
Fig. 5C
Fig. 5D

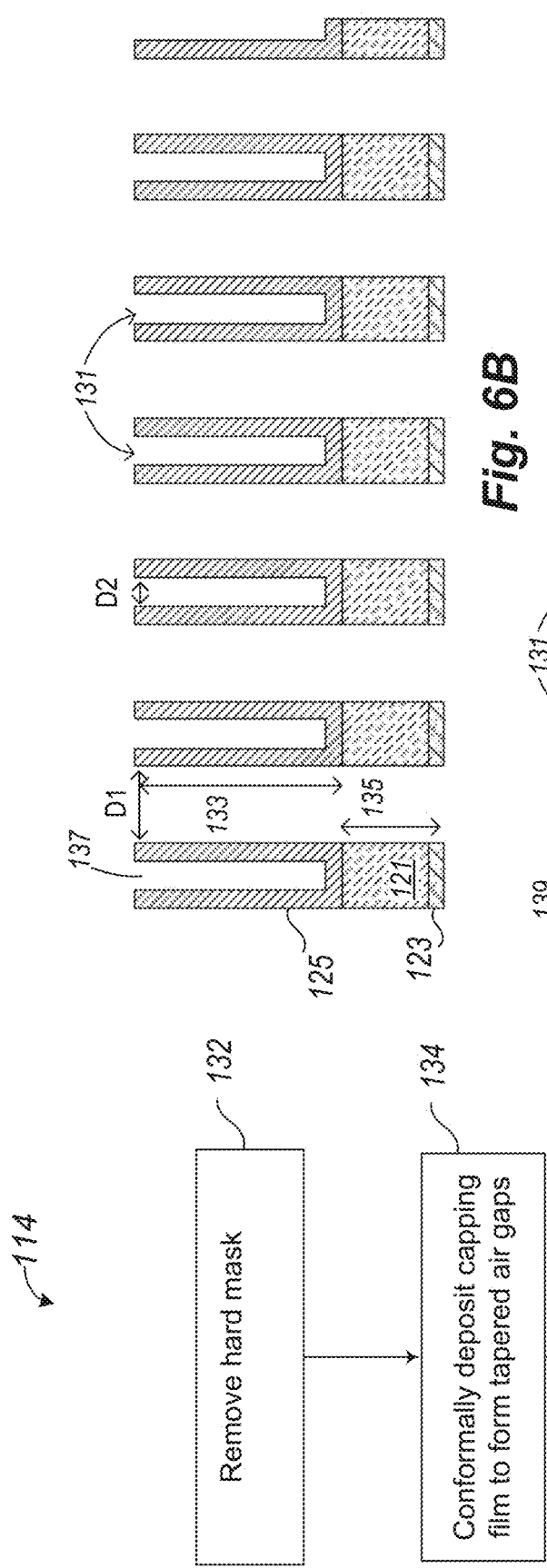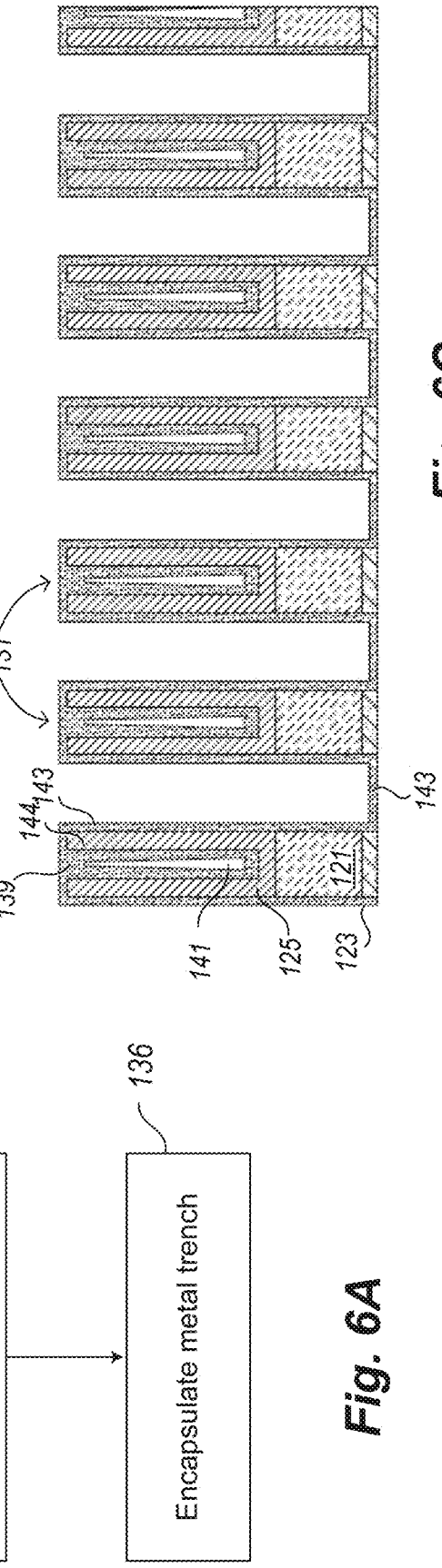

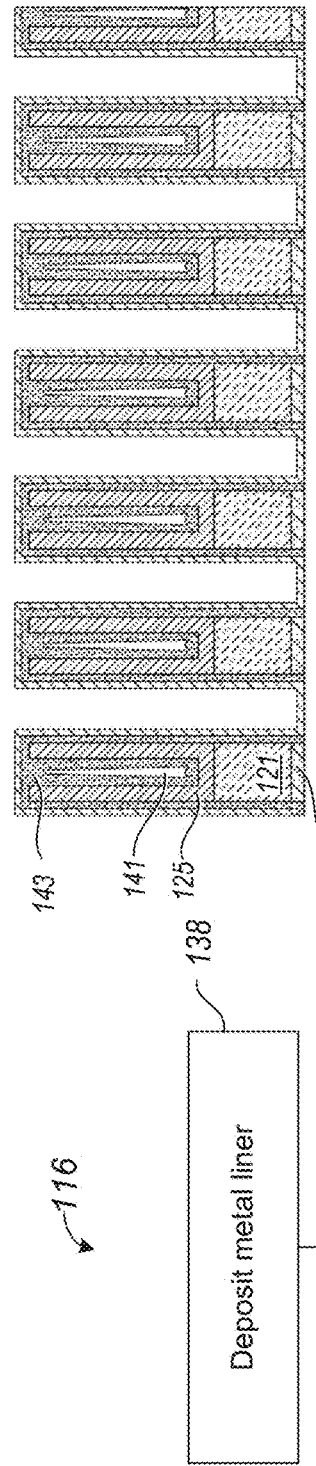
Fig. 7B
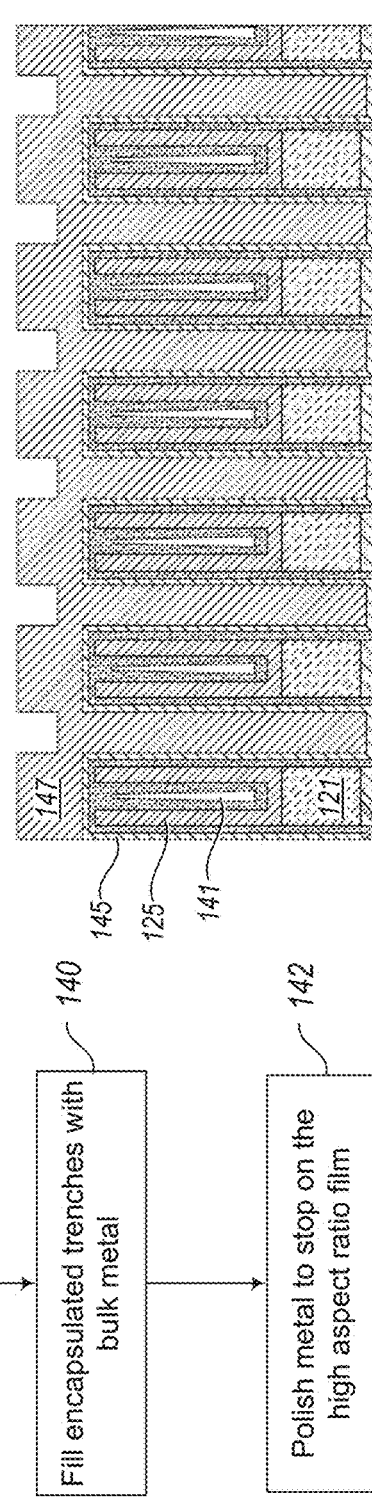
Fig. 7C
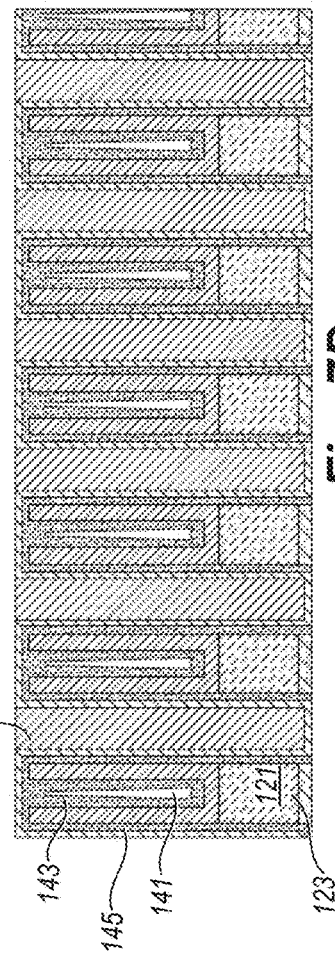
Fig. 7D
Fig. 7A

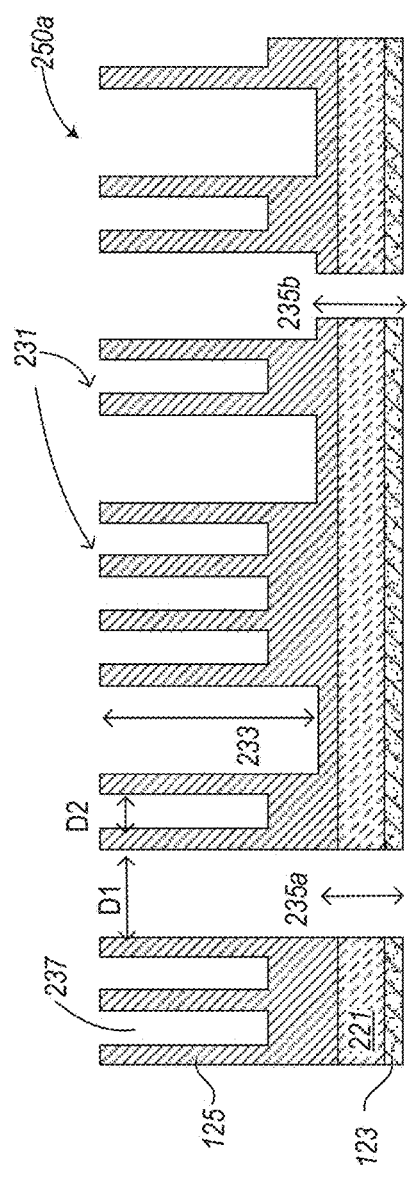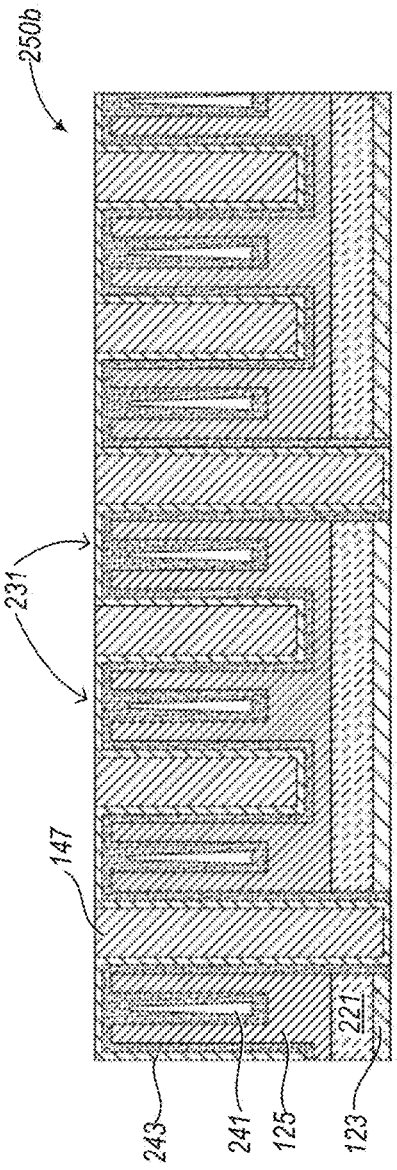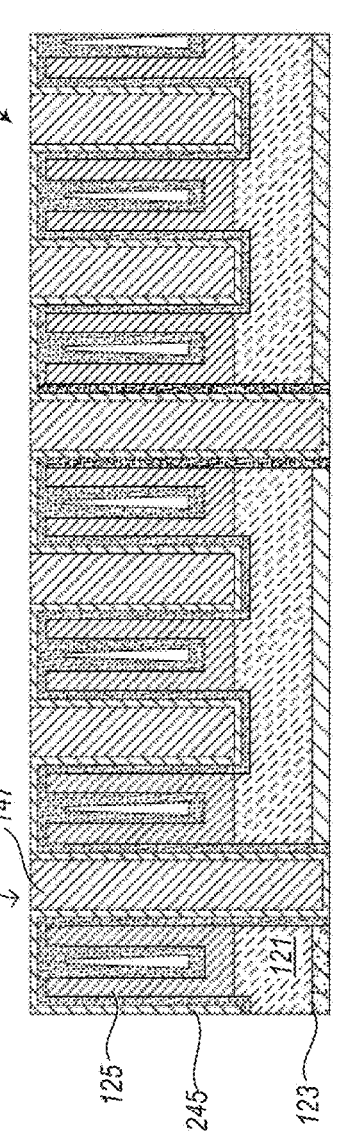
Fig. 8A
Fig. 8B
Fig. 8C

ADVANCED INTERCONNECT WITH AIR GAP

BACKGROUND

Technical Field

The present disclosure relates to the fabrication of nanowires for interconnecting integrated circuits and, in particular, to improvements in performance and reliability of inter-layer dielectrics used in a dual damascene process.

Description of the Related Art

There has been widespread use of damascene interconnect structures in microcircuit fabrication since the late 1990s when the semiconductor industry shifted from aluminum to copper metallization. A damascene interconnect process forms inlaid copper wiring by first etching trenches in a dielectric material, and then filling the trenches with copper, typically using a plating process such as, for example, electroplating. Through the use of a damascene process, semiconductor manufacturers can avoid etching copper. The term "dual damascene" refers to a process in which vertically adjacent metal lines and vias connecting them are formed in the same dielectric layer. FIG. 1 shows an inlaid metal structure 80 formed by such a dual damascene process, in which metal lines 82 and 84 are connected by a via 86 formed in a dielectric layer 88. A dual damascene process permits filling the trench for the upper metal line 84, and the via 86, in the same metal deposition step. Dual damascene integration schemes can, for example, form the via 86 first, and then the trench for the upper metal line 84, and then fill both at the same time. Or, the trench for the upper metal line 84 can be formed first, and then the via 86. Typically, trenches are wider than vias, so that an element of the final structure that includes the upper metal line 84 and the via 86 resembles a "T" shape as shown in FIG. 1. Alternatively, the trench widths and the via width connecting the trenches may be of comparable size, in which case an element of the final interconnect structure above the lower metal line 82 resembles a straight column, or an "I" shape, instead of a "T" shape.

Current trends in the fabrication of dual damascene interconnect structures for integrated circuits include investigating mechanical properties of low dielectric constant (low-k) and ultra-low-k (ULK) dielectric materials used as insulation between the metal lines and the vias. Generally, it is desirable to use electrically insulating material that has a low dielectric constant, to reduce capacitance between adjacent nanowires. However, as the dielectric constant of such materials is reduced below a value of about 2.4 to achieve better electrical performance, the dielectric materials are becoming become more porous, with problematic consequences, as described below.

Illustrations of damascene structures that employ ULK inter-layer dielectrics as shown in FIGS. 2A-2D are found in an industry presentation given at Stanford University by the consortium Sematech International, entitled "Overview of Dual Damascene Cu/Low-k Interconnect." A porous ULK dielectric film 90 used as an inter-layer dielectric is shown in FIG. 2A, as indicated by holes 92 distributed throughout the material. The holes 92 in this example are as large as several tens of nm across. Consequently, mechanical properties such as the Young's modulus, cohesive strength, and adhesion of such porous films are degraded. For example, the modulus of such a porous film scales with the dielectric constant such that ULK films have low modulus, whereas higher k films have a higher modulus. As the structural stability of the ULK dielectric film 90 becomes compromised, cracks 94 tend to form in response to film stress, as shown in FIG. 2B. Such cracking can occur when the ULK dielectric film 90 is subjected to thermal cycling or high pressure conditions during further processing of a semiconductor wafer, or during electronic packaging of a finished integrated circuit chip.

Another problem that tends to occur after etching ULK films is referred to as "dielectric flopover," in which high aspect ratio structures 96 have been found to be unstable and tend to lean sideways as shown in FIG. 2C. As minimum dimensions shrink, vias, which provide vertical connections between adjacent metal lines, become tall and thin. Such structures that have a height-to-width ratio of greater than in the general range of 3 or 4 are referred to as high aspect ratio structures. It is more difficult for metal deposition processes to fill high aspect ratio vias, which results in metal voids 98 as shown in FIG. 2D. In summary, ULK dielectrics tend to be mechanically unstable, and are prone to have poor strength, poor adhesion, dielectric flopover, cracks, and voids.

FIG. 3 shows a table 100 in which material properties of ULK materials are compared with those of conventional silicon dioxide ($SiO_2$) used as an inter-layer dielectric. With reference to the first and fifth rows of the table 100, it is seen that a reduction in the dielectric constant k from 2.2 to 1.03 is associated with an increase in porosity from 0 to about 50%. Accordingly, the modulus, hardness, and thermal conductivity of such ULK materials are each reduced by about a factor of 7, compared to conventional $SiO_2$.

BRIEF SUMMARY

An advanced damascene interconnect structure for microelectronic circuits incorporates a plurality of air gaps into a high modulus insulator to reduce capacitance between adjacent nanowires while maintaining structural stability. The nanowires are formed by an array of metal lines positioned among insulating columns. The embodiments presented herein are characterized by the inclusion of a high modulus insulator above a dielectric layer, and a high aspect ratio film inlaid within the high modulus insulator, sealing the air gaps. Related embodiments by the present inventors are disclosed in U.S. patent application Ser. No. 13/731,878, filed on Dec. 31, 2012.

The dielectric constant of air is 1.0, significantly lower than that of any solid material used in semiconductor fabrication. Thus, incorporation of an air gap in a layer compensates for the use of a higher modulus insulator film having a dielectric constant greater than the typical ULK value of about 2.2, such that the resulting interconnect structure has an effective dielectric constant less than 2.0. In the embodiments presented herein, the higher modulus film containing the air gap is used as an insulator between metal-filled trenches, for example, at the same level as metal 3 or metal 4 while the ULK film is retained to insulate vias. The dielectric layer between two adjacent metal lines might include both a ULK and a high-modulus dielectric having air gaps, thus forming a bi-layer.

In one embodiment, a fabrication method to form such an advanced damascene interconnect structure includes patterning freestanding dielectric U-shaped structures having a selected width-to-spacing ratio, creating air gaps within the freestanding U-shaped structures, and creating metal trench/via columns between the U-shaped structures. Patterning the freestanding dielectric U-shaped structures can be done via a sidewall image transfer technique.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 2A is a failure analysis cross-sectional micrograph showing porosity of a ULK dielectric material.

FIG. 2B is a failure analysis cross-sectional micrograph showing cracking in a ULK dielectric material.

FIG. 2C is a failure analysis cross-sectional micrograph showing dielectric flopover in a ULK dielectric material.

FIG. 2D is a failure analysis cross-sectional micrograph showing a large void in a ULK dielectric material.

FIG. 3 is a table listing material properties of ULK dielectrics and silicon dioxide used as a dielectric.

FIG. 5A is a detailed process flow diagram showing a sequence of process steps that can be used to create freestanding dielectric U-shaped structures, according to one embodiment.

FIGS. 5B-5D are cross-sectional views of profiles formed by each of the process steps shown FIG. 5A.

FIG. 6A is a detailed process flow diagram showing a sequence of process steps that can be used to create tapered air gaps within the U-shaped structures, according to one embodiment.

FIGS. 6B-6C are cross-sectional views of profiles formed by each of the process steps shown FIG. 6A.

FIG. 7A is a detailed process flow diagram showing a sequence of process steps that can be used to create metal trench/via columns between the U-shaped structures, according to a first embodiment.

FIGS. 7B-7D are cross-sectional views of profiles formed by each of the process steps shown FIG. 7A.

FIGS. 8A and 8B are cross-sectional views of profiles formed by a process that can be used to create metal trenches between the U-shaped structures, according to a second embodiment.

FIG. 8C is a cross-sectional view of a profile formed by a process that can be used to create metal trenches between the U-shaped structures, according to a third embodiment.

DETAILED DESCRIPTION

Figure 1:
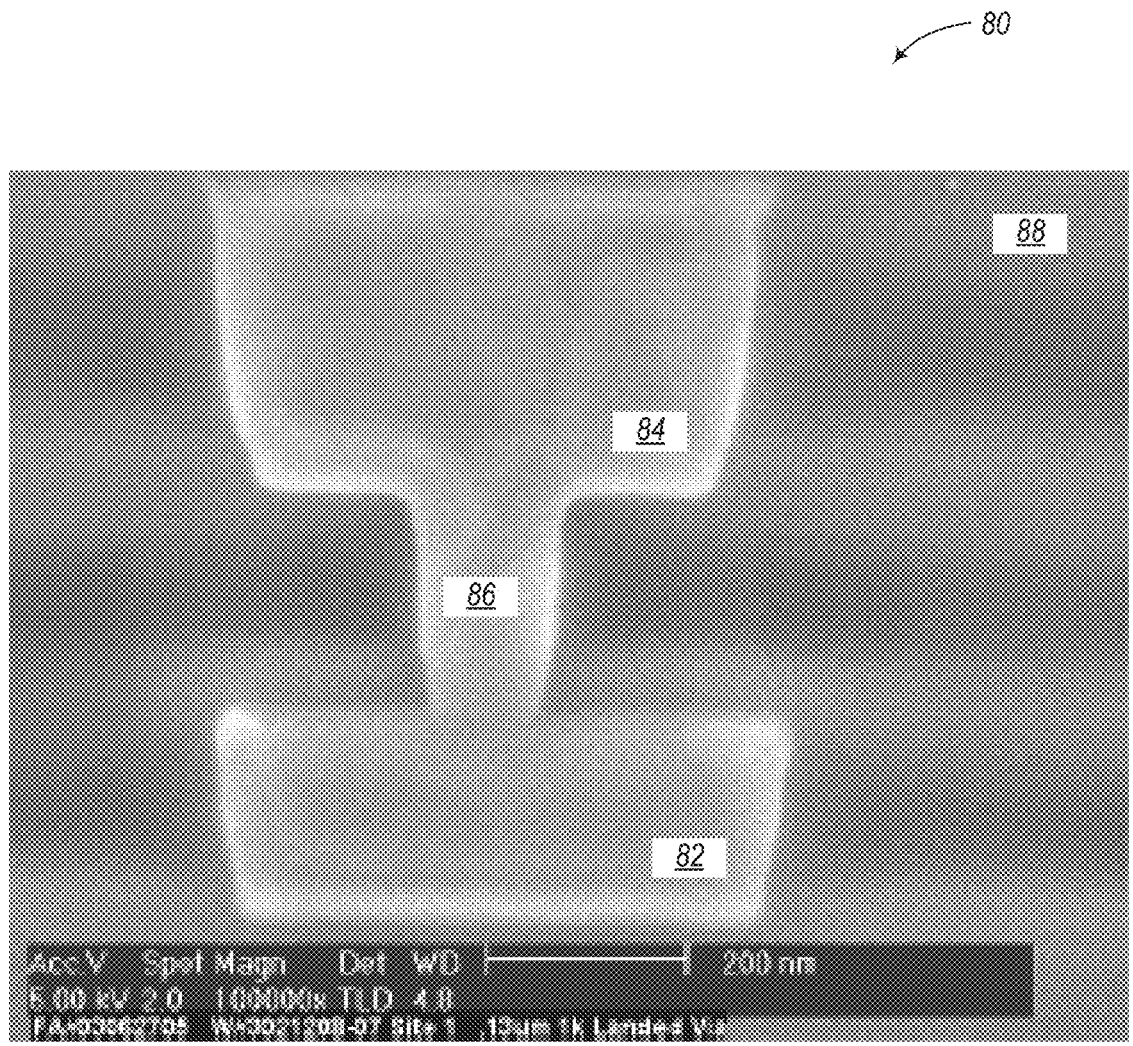
FIG. 1 is a cross-sectional micrograph of adjacent metal lines connected by a via, formed by a dual damascene fabrication process.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Fabrication of microcircuits generally entails performing a series of deposition and patterning operations to build integrated structures on a semiconductor substrate, one layer at a time. Each layer is formed by growing or depositing a film on the substrate, patterning a photo-sensitive mask using lithography, and transferring the mask pattern to the film by etching. Often, structures already formed on the substrate are protected by hard masks while new structures are created. Such use of hard masks adds masking layers to the fabrication process. Overall fabrication costs scale with the number of layers used and the number of mask patterning cycles needed. Lithography masks are expensive to design and to integrate into an existing fabrication process. For these reasons, it is generally advantageous to reduce the number of mask patterning cycles if alternative processing schemes can be substituted.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask such as a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion etching (RIE), washing, wet cleaning, precleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to planarized metal interconnect structures and photonic structures that have been produced; however, the present disclosure and the reference to certain materials, dimensions, and the details and ordering of processing steps are exemplary and should not be limited to those shown. The terms "planarize" and "polish" are used synonymously throughout the specification.

In the figures, identical reference numbers identify similar features or elements. The sizes and relative positions of the features in the figures are not necessarily drawn to scale.

Figure 4:
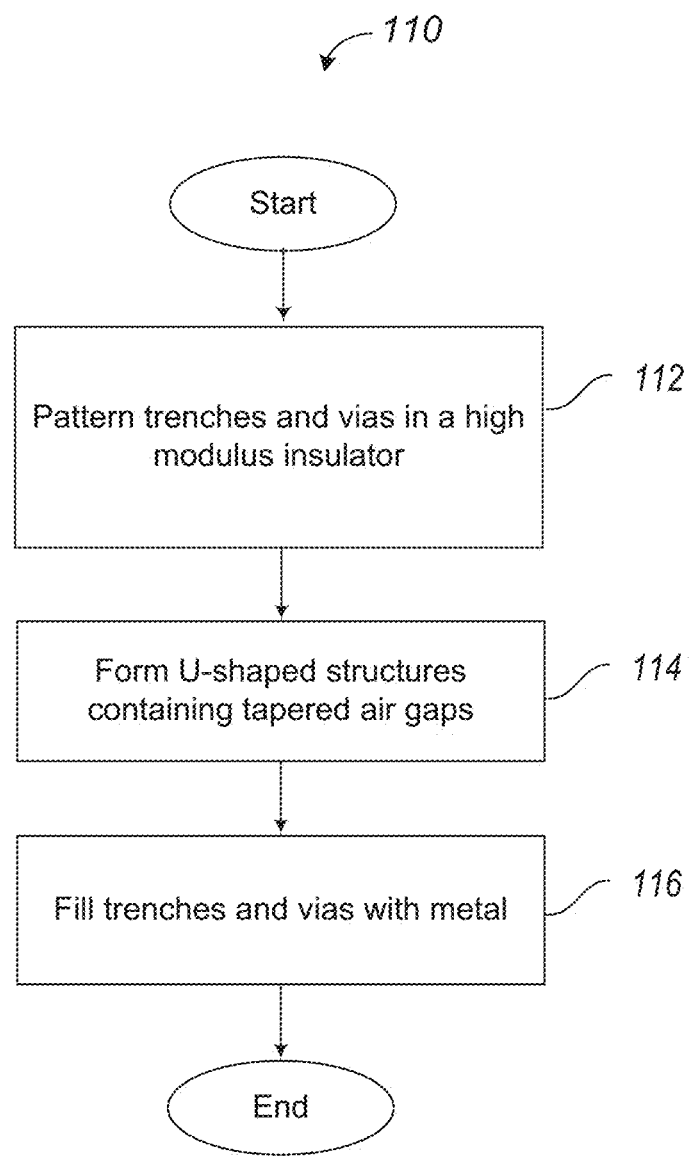
FIG. 4 is a high level flow diagram showing an overview of a method of making an advanced interconnect structure that includes air gaps, according to one embodiment.

FIG. 4 shows generalized steps in a fabrication method 110 for producing an advanced interconnect structure having air gaps, according to one embodiment described herein.

At 112, a high-modulus insulator is patterned to form trenches of width D1 and, in one embodiment, freestanding dielectric U-shaped structures. The freestanding dielectric U-shaped structures preferably have an aspect ratio of at least 4:1. They are thus high aspect ratio structures. The regions inside the U-shaped structures will contain an air gap and be sealed with dielectric material, while the regions between the U-shaped structures will later be filled with metal. A ratio of trench width to inter-layer dielectric width might satisfy a golden ratio as explained later herein.

At 114, air gaps are created within the dielectric U-shaped structures. In one embodiment, the air gaps will be tapered, while in other embodiments, the air gaps will be generally rectangular with a sealing cap on top.

At 116, metal fills the trenches to create metal lines on top of conductive vias in the dielectric layer, between the U-shaped structures.

Details of the fabrication method 110 are presented below, with reference to FIGS. 5A-7D.

FIGS. 5A-5D describe and show details of the step 112 that are carried out to form freestanding dielectric U-shaped structures as shown in FIG. 5D, according to one embodiment described herein. Such structures can be formed in a variety of ways.

Shown in FIG. 5B is a dielectric film stack that has been formed over a substrate 123. In some embodiments, the substrate 123 is a combined set of layers formed either prior to or after a first metal interconnect layer. In such an example, the substrate 123 shown in the figures can represent a monocrystalline semiconductor substrate which has been overlaid with multiple layers. Such layers can include layers of oxides, nitrides, gate electrodes made of polysilicon or metal, sidewall spacers, contact openings, or other transistor-level features that are commonly formed before the first metal layer. Additionally or alternatively, the substrate 123 may include a silicon carbide-nitride $SiC_xN_y$ base layer having a thickness of about 15-32 nm with two or more metal layers and a semiconductor substrate below it. Alternatively, the substrate 123 can be a bare semiconductor wafer or one coated with an oxide layer.

The freestanding dielectric U-shaped structures shown in FIG. 5D can be formed by etching the trenches first and then the vias, or by etching the vias first and then the trenches. Either way, the trenches are formed over the vias, and the widths of the two are comparable in one embodiment. In such an embodiment, the result is an array of straight vertical spaces among freestanding dielectric structures. In other embodiments, the trenches are wider than the vias, such that the via will be at or near the minimum dimension for that layer. In a semiconductor layout, the smallest that a feature can be made within a lithographic mask is sometimes called the "minimum dimension" and in another context is called the "critical dimension" (CD). For each mask layer, a design rule is established. These are simple, single layer rules that provide a width rule that specifies the minimum width of any shape in the design. The design rule also generally specifies a minimum spacing between two adjacent objects with a spacing rule. In some instances, the minimum spacing design rule will be a different distance than the minimum width design rule, while in some instances, the minimum distance for both the width of a feature and the distance between two adjacent features may also be the same. Generally, reference to the "minimum dimension" refers to the design rule that is the minimum width of any object within that particular mask layer. Further, the design rule dimensions are different for different layers. Generally, the layer at the semiconductor substrate level at which source, drains and channels are formed usually has the smallest possible design rules. Upper metal layers, for example, metal 3, metal 4, generally have much larger design rules. For example, the minimum width design rule at metal 4 may be two or three times larger than the corresponding minimum width design rule of metal 1. This is permitted because generally there are fewer metal interconnect lines at the upper metal levels, for example, at metal 4, 5 and higher, and therefore the design rules can be somewhat relaxed and permit the use of larger structures, which permits such structures to be more reliably formed with a lower likelihood of defects. In addition, the larger design rule permits larger features to be formed in the metal interconnect layers which provide significantly lower resistance and therefore more current carrying capability with less voltage loss. Therefore, the terms "minimum dimension" and "critical dimension" as used herein refer to the minimum size of a particular feature that the design rule permits for that particular individual layer to which it is applied.

At 122, a dielectric layer 121 is deposited on top of the substrate 123. The dielectric layer 121 can be any layer in which vias can be formed during the semiconductor manufacturing process. In one embodiment, the dielectric layer 121 is a thick inter-metal dielectric layer such as a low-k or ultra-low-k (ULK) dielectric, wherein k represents a dielectric constant that characterizes the dielectric material. In the embodiment shown, the ULK dielectric layer 121 desirably has a dielectric constant less than about 2.0 and a thickness target that determines the via height, for example, in the range of about 100-200 nm. Such an inter-metal dielectric layer may be located between metals 1 and 2, metals 3 and 4, or other metal interconnect layers, for example.

At 124, a high modulus insulator 125 is formed above the ULK dielectric layer 121. The high modulus insulator 125 can be made of, for example, a silicon nitride (SiN), silicon carbide (SiC), or silicon carbide-nitride $SiC_xN_y$. It can generally be a ULK dielectric, although known ULK dielectric materials lack sufficient strength to be considered high modulus insulators. Trenches for metal interconnect layers will later be formed in the high modulus insulator 125 to be filled with metal. The thickness target of the high modulus insulator 125 is in the range of about 200-400 nm.

At 126, a hard mask layer 127 is deposited on top of the high modulus insulator 125. In one embodiment, the hard mask layer 127 is made of metal to permit etching the very thick underlying high-modulus insulator 125.

At 128, the hard mask layer 127 is patterned to form a hard mask 129. Patterning the hard mask layer 127 can be accomplished using a sidewall image transfer method, as described in a related patent application, U.S. patent application Ser. No. 14/098,346, entitled "Novel method for Asymmetric Pitch Adjustment with Sidewall Image Transfer," hereby incorporated by reference in its entirety. In the sidewall image transfer method, a sloped mandrel and a sidewall blocking mask are used to open an array of large openings having a width D1, and an array of smaller openings having a width D2, respectively, in the hard mask layer 127. The large opening D1 defines the width of metal lines which include both trenches and vias. In one embodiment, the trenches are positioned directly above the vias, and both the trenches and vias have width D1. In other embodiments, the trench can have a large width D1 and the via a smaller width D3. The small opening D2 defines the width of a dielectric bi-layer trench that will include an air gap to electrically insulate adjacent metal lines from one another. In one embodiment, a target width-to-spacing ratio of D2/D1 is set at 0.618, which is a golden ratio that yields a preferred opening distribution and relationship. The hard mask 129 can now be used to pattern the underlying high-modulus insulator 125.

At 130, the high-modulus insulator 125 is etched to form freestanding U-shaped structures 131. In one embodiment, the U-shaped structures 131 are spaced so as to have a 64-nm pitch. The etch process used is a plasma-based reactive ion etch that first removes the high modulus insulator 125 to form trenches 133 having width D1, and then removes the ULK dielectric layer 121 to form vias 135 directly underneath the trenches 133, the vias 135 also having width D1. The depth of the trenches can be approximately the same as the vias or might be up to twice the depth of the vias. While the trenches 133 and vias 135 are being etched, the high modulus insulator 125 between the trenches 133 is also etched to form the U-shaped structures 131, with the etched recesses having a width D2. Because less etchant reaches the material within recesses 137 having a small width D2, the U-shaped structures 131 etch more slowly, compared to the regions 133 and 135 separating the U-shaped structures 131. As a result, etching of the recesses 137 will usually stop before reaching the ULK dielectric layer 121, at a recess depth of about 40 nm. Whereas, etching of the trenches 133 and vias 135 between the U-shaped structures 131 continues through the entire ULK dielectric layer 121, into the substrate 123. If the substrate 123 is a thin silicon carbide-nitride $SiC_xN_y$ layer, the exposed layer of the substrate 123 may be removed, leaving behind U-shaped structures 131 as shown in FIG. 5D that are no longer connected, but are instead freestanding. The dielectric U-shaped structures 131 made according to the process described above are able to stand erect without cracking or tipping over. This is permitted in one embodiment by using a stiffer and stronger material in some parts of the ULK dielectric layer 121.

The metal, when deposited into the via opening 135, will therefore be in contact with the metal layer that is below the top layer of the substrate 123. For example, if the metal layer being deposited into the trenches 133 is metal 4, then etching away the layer 123 will permit the filled via to couple the underlying metal 3 to metal 4 at those particular locations, but the two metal layers will remain electrically isolated at those locations where vias 135 are not formed.

Generally, the ULK dielectric layer 121 and the high modulus insulator 125 will be made of multiple sublayers. For example, it would be common to make ULK dielectric layer 121 having a first base layer of a type of silicon nitride on top of which is formed a nanopores or aerogel layer that includes some form of silicon dioxide or other layer. There may be two or three types of ULK dielectrics on top of each other within the main ULK dielectric layer 121. Similarly, the high modulus insulator 125 may have two or more sublayers making up the entire layer. For example, one of the sublayers may be a relatively strong layer having silicon, carbon, and nitrogen therein. It may also be a relatively strong layer having just silicon and carbon therein. Other sublayers of the high modulus insulator 125 may include silicon dioxide, silicon nitride, a ULK layer of any one of the many acceptable ULK materials or many other sublayers. In one embodiment, it is preferred to ensure that the high modulus insulator 125 has more mechanical strength than the ULK dielectric layer 121 to ensure that the air gaps to be formed at the regions D2 will be supported by structure and will not collapse. Even though the high modulus insulator 125 may be mechanically stronger, it may have a similar dielectric constant to that of the material used in the ULK dielectric layer 121 and, once the air gaps are formed, it may have a similar or even lower dielectric constant overall as a layer than that of the ULK dielectric layer 121.

FIGS. 6A-6C describe and show details of the step 114 that are carried out to form air gaps and encapsulated trenches and vias, as shown in FIG. 6C, according to one embodiment described herein.

At 132, the hard mask 129 is removed, using an anisotropic RIE process that can remove metal without attacking the underlying SiN or $SiC_xN_y$ layers or other materials that might be part of the high modulus insulator 125 or the ULK dielectric layer 121.

At 134, the recesses 137 of the U-shaped structures 131 are capped with a layer 139. The capping layer 139 will cap each U-shaped structure so as to include an air gap 141, thus forming a plurality of air gaps 141 that extend vertically within the recesses 137. The capping layer 139 is desirably capable of capping the recesses 137 so as to close the small openings of size D2. In one embodiment, such a capping layer 139 includes a filler material made of SiC. The dimension D2 is selected in conjunction with the conformal film which is to form the capping layer 139. In one embodiment, the capping layer 139 is a conformal layer which conforms generally to the interior of the U-shaped structure 131 having a gap distance D2 and as it conformally fills the trench the top portion will touch and create a cap after which further filling of the trench is blocked, resulting in air gaps 141. Alternatively, the distance to the air gap D2 may be relatively small compared with the coverage capabilities of the capping layer 139 resulting in the cap being formed almost immediately upon the deposition starting so that little to no material from the capping layer 139 enters the U-shaped structure 131. Therefore, the top of the U-shaped structure 131 will be essentially capped and maintain nearly the same open area as when it was originally etched. There may be some small amount of capping layer material 139 deposited on the very bottom of the U-shaped structure 131 with little deposited on the sides before the layer caps the top of the U-shaped structure 131, thus sealing it off against further deposition of material. For layers which are very conformal, the distance D2 may be somewhat smaller in order to ensure that a cap is formed to seal it off prior to completely filling the U-shaped structure 131 to ensure that the air gap 141 remains. On the other hand, if the capping layer 139 is not very conformal and tends to deposit more heavily at the corners and on the top, it may be permitted to have D2 be a somewhat larger dimension and still be assured that the top will cap off while still leaving an air gap 141 inside of the U-shaped structure 131. Accordingly, the dimension D2 is selected to ensure that adjacent capping layers 139 will touch each other at the top opening of the U-shaped structures 131 to seal off the top and form a sealing cap before the central portion of the region is fully formed to ensure that the air gap 141 remains. As previously mentioned, in some embodiments the selection of the width D2 together with the material used for the capping layer 139 will result in a cap being formed at the top portion of the trench 131 with little to no material of the capping layer 139 in the trench, thus maintaining a larger air gap and a correspondingly smaller dielectric constant. Since the dielectric constant of the air is 1.0 and it is substantially smaller than that of any other material, it is desired to have the air gap as large as practical within the constraints of the materials used and to provide sufficient structural integrity for the high modulus layer 125 after the metal is deposited therein. In one embodiment, the material for the capping layer 139 is silicon carbide which has a high physical strength and can be adjusted to be deposited to be ensured that it will build up at the top of the U-shaped structure 131 to create a cap that seals off the U-shaped structure 131 when the U-shaped structure 131 is only partially filled with the capping layer 139, thus ensuring that the air gap 141 will be present. By custom selection of the width D2 and the deposition properties of the SiC, a relatively large air gap 141 can be obtained, in some instances nearly the entire dimension of the original volume of the U-shaped structure 131.

At 136, further deposition of the high aspect ratio film as the capping layer 139 closes the small recesses 137 of width D2. In the embodiment shown, the capping layer 139 also serves as an encapsulant 143, lining sidewalls of the shallow trenches that will be filled with metal. The encapsulant 143 also lines the bottoms of the vias 135 temporarily, as shown in FIG. 6C, until the metal is deposited in the vias 135 at a subsequent step. The encapsulant 143 joins the U-shaped structures 131 at the bottom so they are no longer freestanding. The encapsulant 143 helps to prevent leakage between adjacent metal lines, as well as preventing failure modes known to those skilled in the art such as electromigration (EM) and time-dependent dielectric breakdown (TDDB). In other embodiments, the capping layer 139 may be planarized so it is even with the tops of the U-shaped structures 131, and then a separate encapsulant 143 may be deposited.

In one preferred embodiment, the capping film 139 is preferably a high aspect ratio film that enters into the recess 137 which has been etched, even though the recess 137 is a narrow aperture. The benefit of having a high aspect ratio film 139 is that it fills the interior of the recess 137 as well as providing the encapsulant 143 that lines the outside surfaces of the U-Shaped structures 131 with a narrow layer, thus reinforcing the mechanical strength of the walls 144 of the U-shaped structures 131. Preferably, each wall 144 has sufficient strength that it is both self-supporting and will not collapse or be crushed under the weight of additional layers which will be deposited on top of it during subsequent steps in the semiconductor process. In some process technologies, the recess 137 will be sufficiently large and the walls 144 sufficiently small that they do not have sufficient mechanical strength to support the layers which will be deposited on the top of them during subsequent semiconductor processing steps. Accordingly, the high aspect ratio film 139 is selected as a reinforcing material. In one example, silicon carbide (SiC) is selected as the reinforcing material, because SiC has high mechanical strength and yet it can be deposited as a thin layer with a high aspect ratio. Thus, a thin film encapsulant layer 143 is provided on each side of each wall 144, providing sufficient mechanical strength and reinforcement that when subsequent layers are deposited on top of the U-shaped structure 131 it can support this weight and not be crushed even though there is an air gap present within the U-shaped structure 131. Accordingly, the air gap 141 formed during deposition of the high aspect ratio film 139 is maintained with sufficient structural integrity because both the wall 144 and the high aspect ratio film 139 act together to provide sufficient mechanical strength so that air gap 141 may remain and yet the layer overall has sufficient strength that it does not collapse after subsequent layers are put on the top thereof during further semiconductor processing steps until the chip is completed.

The result shown in FIG. 6C is a regular array of insulating columns in the form of the U-shaped structures 131, each supporting within it a tapered air gap 141 that is sealed by the conformal layer 139. In other embodiments, the air gaps can take on different shapes, orientations, and arrangements. However, the air gaps 141 are generally contained within a structurally stable supporting column having a high modulus. Furthermore, the volume of trapped air is such that the effective dielectric constant of structure as a whole, that is, including the air, the high modulus structure, and the filler material is less than about 2.0

FIGS. 7A-7D describe and show details of the step 116 that are carried out to form the tapered air gaps 141 and encapsulated trenches and vias, as shown in FIG. 7D according to one embodiment described herein. In the embodiment shown, the tapered air gaps 141 have a triangular shape that is wider at the bottom and narrows to a point at the top. However, alternative embodiments can include an air gap of any shape, or multiple air gaps, by design. In a sense, the controlled formation of the air gaps can be thought of as a way of designing and engineering porosity into a high-strength material.

At 138, a conformal metal liner 145 is deposited over the array of U-shaped structures 131. In those vias 135 in which contact to a lower metal layer is desired, the capping layer 139 will generally be etched from the bottom of the via in order to ensure that the metal liner 145 contacts the metal layer below. Such etching can occur during deposition of the conformal metal liner 145 by using ion bombardment to remove, anisotropically, the thin layer of encapsulant 143 at the bottom of the vias 135, while leaving the encapsulant 143 in place on the sidewalls of the trenches 133 and vias 135. The metal liner 145 thus establishes a conductive path between a metal layer below the substrate 123, if applicable, and the current metal layer. In the example of FIG. 7B, this capping layer 139 is shown etched away at some of the locations, while being present at other locations at which it is desired to not have a via extend completely from, for example, metal 4 to metal 3. At those locations in which the via does not extend all the way from one metal layer to another, it may also be that the via depth is not fully etched all the way down and instead more insulating material may be left between the adjacent metal layers in order to ensure that there is no electrical contact at those locations. Often, such a design will include dummy structures in order to provide smooth etching and a well-balanced layout. Therefore, there may be a number of instances in which metal is deposited into those locations in which no via is formed and there will be no subsequent electrical connection to the metal. Nevertheless, the via is present in order to form a dummy structure which has a number of benefits in semiconductor processing, as is well known in the art and need not be described in detail herein.

The metal liner 145 forms a barrier, laterally, between the encapsulant 143 and the conducting trench fill material to be deposited next. In one embodiment, the conformal metal liner 145 can include two layers, for example, a bottom layer made of titanium nitride (TiN) that adheres well to the encapsulant 143, and a top layer made of tantalum nitride (TaN) that provides a barrier to subsequent deposition of a copper interconnect layer. Such a two-layer conformal metal liner 145 can have a representative total thickness of 8-10 nm. In other embodiments, the conformal metal liner 145 can be a single layer, for example, TaN, having a thickness of less than 8 nm.

At 140, the vias 135, and subsequently the trenches 133, are filled with a bulk metal 147. The bulk metal trench fill material in the embodiment shown is desirably a metal suitable for use as a nanowire interconnect material. Such bulk metals include, for example, copper, aluminum, tungsten, silver, gold, titanium, platinum, tantalum, or combinations thereof. Combinations of such metals include layered metal stacks or alloys. The bulk metal trench fill process can be a plasma deposition such as chemical vapor deposition (CVD) or plasma vapor deposition (PVD). Alternatively, the bulk metal trench fill process can be a plating process such as electroplating or electro-less plating. In one embodiment, a plating process is used that includes depositing a copper seed layer followed by a bulk copper layer. The metal fill process is preferably conformal. Because the metal CD has a large width D1, there should not be a gap fill problem.

At 142, the bulk metal 147 and the conformal metal liner 145 that remains on top of the U-shaped structures 131 are polished to stop on the high aspect ratio film 139. The CMP process used for polishing the bulk metal 147 can entail use of a slurry made from silica and hydrogen peroxide ($H_2O_2$), and a soft polish pad, for example. The CMP process can be timed based on a known polishing rate of the bulk metal and the metal liner materials. Or, the CMP process can be end-pointed to stop upon detection that the underlying high aspect ratio film 139 layer has been exposed. Additionally or alternatively, a touch CMP process can further be performed to gently remove remnants of the surplus bulk metal 147 and the thin conformal metal liner 145. The touch CMP process can be a brief surface polish in which the polish pad rotation speed and pressure are set to relatively low values to remove residual amounts of material while limiting the degree of surface abrasion. Alternatively, a touch clean can be substituted for the touch CMP process. The touch clean can use, for example, a wet clean chemistry that includes hydrofluoric acid (HF) diluted with de-ionized water (DI) in a 1000:1 ratio (DI:HF). Additionally or alternatively, the CMP process used for polishing the conformal metal liner 145 can entail use of a chemical formula that removes metal selective to the high aspect ratio film 139.

A final interconnect structure 150 shown in FIG. 7D solves many of the problems described above. Because the insulator between the metal lines includes an air gap, the effective dielectric constant is less than 2.0, while still providing advantageous structural properties. Thus, holes essentially have been incorporated into the dielectric material in an organized fashion so as not to weaken the overall interconnect structure. Such a low dielectric constant achieves a low capacitance between the metal lines. The ULK material between the vias can be a low-k material as well, because the mechanical strength of the high modulus insulator prevents ULK flopover during processing. The metal fill is uniform due to the larger width trenches D1. The desired pitch scaling can still be maintained with the wider trenches by reducing the width of the insulating structures. This pitch reduction is also made possible by use of the high modulus insulator material, as well as patterning techniques such as sidewall transfer and the metal hard mask. Finally, using the golden ratio to define the ratio of the trench width D1 to the width D2 results in an optimal distribution between the two structures.

Additional embodiments 250a and 250b are presented in FIGS. 8A-8B as alternatives to the interconnect structure 150. An intermediate structure is shown in FIG. 8A for direct comparison with FIG. 6B, following hard mask removal at 132. An additional embodiment of a final interconnect structure 250b is shown in FIG. 8B.

The interconnect structure 250a differs from the interconnect structure 150 in several respects. First, 250a includes various configurations of U-shaped structures among trenches to demonstrate that, depending on the local mask design, the U-shaped structures can alternate with the trenches 233 as shown in FIG. 6B, or there can be several U-shaped structures between a pair of trenches 233. At the plane of the cross section shown in FIG. 8A, two of the trenches 233 are shown aligned with vias 235a and 235b. The exemplary via 235a is shown as having a width substantially equal to that of the trench width, D1. The exemplary via 235b is shown narrower than the trench width D1. In one embodiment, other trenches are connected to vias that do not happen to intersect the cut plane shown. Second, the interconnect structure 250a has a thinner dielectric layer 221, compared with the original dielectric layer 121. Third, the depth of the trench 233 shown in FIG. 8A is generally shallower than the depth of the trench 133, which extends to the boundary of the dielectric layer 121. In the interconnect structure 250a, it is shown that in some areas where there exist metal lines but not vias, the trench etch process stops within the high modulus insulator 125 before the dielectric layer 221 is encountered, instead of extending all the way through the material stack. As a result, FIG. 8A does not show freestanding U-shaped structures, but instead, FIG. 8A shows U-shaped structures 231 that remain laterally connected at the base by a continuous substrate 123 and a continuous dielectric layer 221. Associated U-shaped recesses 237, which are formed at 130 during the same etch step as the trenches 233, are therefore shallower than the U-shaped recesses 137 shown in FIG. 6B. The shallower recesses 237 result in a shorter air gap 241.

The exemplary final interconnect structure 250b has features in common with the interconnect structure 250a but exhibits a regular alternating pattern of air gaps between adjacent metal lines. One advantage of the final interconnect structure 250b is that the bulk metal 147 is fully encapsulated by the high modulus insulator 125 for further protection against electromigration effects. One disadvantage is that there is a smaller volume of air trapped within the shorter air gap 241 than within the taller air gap 141.

A hybrid embodiment 350 that combines aspects of the interconnect structure 150 and the interconnect structures 250a and 250b is illustrated in FIG. 8C as a hybrid embodiment 350. In the hybrid embodiment 350 the thicker dielectric layer 121 used in the interconnect structure 150 is combined with the shorter trench 233. Thus, the trench 233 extends partially into the dielectric layer 121, as shown in FIG. 8B, instead of completely, as shown in FIGS. 7B-7D, or not at all into the dielectric layer 221, as shown in FIG. 8C.

In summary, after the structure of FIG. 7D is completed, additional layers will be placed on the top thereof, for example, perhaps repeating the layer of FIG. 7D on top of the same structure that is shown in FIG. 7D for repeated layers, for example, metal 4, metal 5, metal 6, and upper layers. The lowermost of those layers, for example, metal 2, will have to bear significantly more weight and receive more stress as the upper metal layers are deposited and formed. Accordingly, the thickness of the capping layer 139 as deposited may be custom selected to ensure that sufficient mechanical strength is provided at the particular layer where needed. At a lower layer, such as metal 2, the capping layer 139 may be somewhat thicker to provide additional mechanical strength on the sidewalls 144. Even when the air gap 141 has been formed and the capping layer 139 has sealed, or encapsulated, the top, the capping layer 139 can still be deposited on the sidewalls 144 on the outer surfaces thereof to provide additional mechanical strength if desired. In some layers, the additional mechanical strength may be desired. In other layers, such as the topmost metal layer, it may be desired to deposit the capping layer 139 sufficient to form the encapsulant 143 and to seal the recess 137 so as to form air gap 141. In some embodiments, as discussed herein, this capping layer 139 may seal off the recess 137 when little or no capping layer material has entered the air gap 141 so that the air gap has substantially the same volume as when it is first formed. The process will therefore be selected to form an air gap 141 of a desired size in conjunction with selecting a width of walls 144 and a thickness of the high aspect ratio film that forms the capping layer 139 in order to ensure sufficient mechanical strength to support the insulator between adjacent metal interconnection layers 147 while at the same time providing a large air gap 141. Circuit designers may need to select a balance between the side of the air gap 141, which has no structural strength, and the thickness of the walls 144 that provide the structural strength to make the air gap 141 as large as is practical while ensuring that the sidewalls 144 do not collapse over the lifetime that the semiconductor chip will be used, to maintain the structural integrity and long term reliability.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
forming a dielectric layer on a semiconductor substrate;
forming a high modulus insulator film on the dielectric layer;
patterning the high modulus insulator film using a hard mask to form trenches and vias among insulating columns;
conformally depositing a layer on the trenches, vias and insulating columns, the conformally deposited layer forming tapered air gaps surrounded by the conformally deposited layer, each of the air gaps being within a respective one of the insulating columns and the conformally deposited layer encapsulating the trenches and vias; and
filling the encapsulated trenches and vias with metal.

2. The method of claim 1 wherein patterning the high modulus insulator film using the hard mask forms an array of insulating columns that are freestanding.

3. The method of claim 1 wherein filling the encapsulated trenches and vias with metal includes first depositing a conformal metal liner and then depositing a bulk metal.

4. The method of claim 1 wherein filling the encapsulated trenches and vias with metal forms metal lines directly above filled vias.

5. The method of claim 1 wherein patterning the high modulus insulator film uses a dual damascene process that includes first etching trenches followed by etching vias, stopping on the substrate, to create the array of freestanding insulating columns.

6. The method of claim 1 wherein patterning the high modulus insulator film uses a dual damascene process that includes first etching vias, stopping on the substrate, and then etching trenches to create the array of freestanding insulating columns.

7. The method of claim 1 wherein patterning the high modulus insulator film uses a dual damascene process in which trenches and vias are aligned and have approximately equal widths.

8. The method of claim 1 wherein patterning the high modulus insulator film uses a dual damascene process in which trenches and vias are formed such that the trenches are approximately twice as deep as the vias.

9. A method of fabricating an integrated circuit interconnect structure on a semiconductor substrate, the method comprising:
patterning trenches and vias among insulating columns in a high modulus insulator on the semiconductor substrate;
forming U-shaped structures in the insulating columns of the high modulus insulator, each U-shaped structure having sidewalls, a bottom and a top;
conformally depositing an insulating capping layer covering the tops of the U-shaped structures and in the trenches and vias, the insulating capping layer forming air gaps within the U-shaped structures covered at the tops with the insulating capping layer; and
filling the trenches and vias with metal to form metal lines and filled vias among the U-shaped structures.

10. The method of claim 9 wherein the patterning dielectric U-shaped structures uses a sidewall image transfer technique.

11. The method of claim 9 wherein the dielectric U-shaped structures have at least a 4:1 aspect ratio.

12. The method of claim 9 wherein at least some of the metal lines are aligned on top of filled vias to form metal interconnect structure elements having a substantially uniform width.

13. The method of claim 9 wherein the dielectric U-shaped structures are made of a bi-layer material that includes one or more of SiN, SiC, and $SiC_xN_y$ on top of a ULK dielectric.

14. A method, comprising:
   patterning trenches and vias among insulating columns in a high modulus insulator on a surface of a semiconductor substrate;
   forming in the insulating columns of the high modulus insulator, U-shaped structures formed entirely from the high modulus insulator;
   conformally depositing an insulating capping layer covering the U-shaped structures to form tapered air gaps surrounded by the insulating capping layer in the U-shaped structures, each of the tapered air gaps extending in a direction orthogonal to the surface of the substrate and having a width that increases towards the surface along the direction orthogonal to the surface, the width being a direction parallel to the surface, wherein the insulating capping layer covers sidewalls of each via and each trench; and
   filling the trenches and vias to form metal lines and filled vias among the U-shaped structures.

15. The method of claim 14 wherein the patterning dielectric U-shaped structures comprises sidewall image transfer.

16. The method of claim 14 wherein each of the dielectric U-shaped structures has at least a 4:1 aspect ratio.

17. The method of claim 14 wherein filling the trenches and vias to form metal lines and filled vias among the U-shaped structures comprises forming at least some of the metal lines aligned on top of filled vias to form metal interconnect structure elements.

18. The method of claim 14 wherein the high modulus insulator comprises a bi-layer material including one or more of SiN, SiC, and $SiC_xN_y$ on top of an ULK dielectric.

19. The method of claim 14 wherein patterning trenches and vias among insulating columns in the high modulus insulator comprises forming the insulating columns of the high modulus insulator and patterning a hard mask to form the trenches and vias among the insulating columns.

* * * * *